United States Patent
Hori (10) Patent No.: US 6,643,920 B2
(45) Date of Patent: Nov. 11, 2003

(54) ELECTRONIC COMPONENT SUCH AS A SAW DEVICE AND METHOD FOR PRODUCING THE SAME

(75) Inventor: Yoshitsugu Hori, Shiga-ken (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 10/170,680

(22) Filed: Jun. 14, 2002

(65) Prior Publication Data

US 2003/0000067 A1 Jan. 2, 2003

Related U.S. Application Data

(62) Division of application No. 09/387,984, filed on Sep. 1, 1999.

(30) Foreign Application Priority Data

Sep. 2, 1998 (JP) .......................................... 10-248258

(51) Int. Cl.[7] ................................................. H05K 3/30
(52) U.S. Cl. ...................... 29/832; 29/840; 228/180.1; 228/180.21
(58) Field of Search .......................... 29/830, 825, 833, 29/840; 228/179.1, 180.1, 180.21

(56) References Cited

U.S. PATENT DOCUMENTS 5,740,606 A * 4/1998 Rose

* cited by examiner

Primary Examiner—Carl J. Arbes
(74) Attorney, Agent, or Firm—Keating & Bennett, LLP (57) ABSTRACT

An electronic component comprises a substrate having a surface on which an electrode is formed and an SAW circuit element having a surface on which a circuit is formed. The circuit element is held such that the surface of the circuit element and the surface of the substrate are opposed to each other. A bump electrode joins the circuit on the circuit element and the electrode of the substrate together, and a sealing material joins the circuit element and the substrate together in the periphery of the space between the circuit-forming surface of the circuit element and the substrate. The space between the circuit-forming surface of the circuit element and the substrate is hermetically sealed by the circuit element, the substrate, and the sealing material. Advantageously, a low-temperature soldering material such as solder, or an adhesive, is used as the sealing material.

5 Claims, 7 Drawing Sheets

ELECTRONIC COMPONENT SUCH AS A SAW DEVICE AND METHOD FOR PRODUCING THE SAME

This application is a Divisional of U.S. patent application Ser. No. 09/387,984 filed Sep. 1, 1999, currently pending.

BACKGROUND OF THE INVENTION

1. Field of the Invention

The present invention relates to electronic components and a method for producing the electronic components, and more particularly to an electronic component such as a surface acoustic wave device (SAW device), a high frequency device, and a module or sub-module including an SAW device and a method for producing these devices.

2. Description of the Related Art (First Conventional Example)

Figure 1:
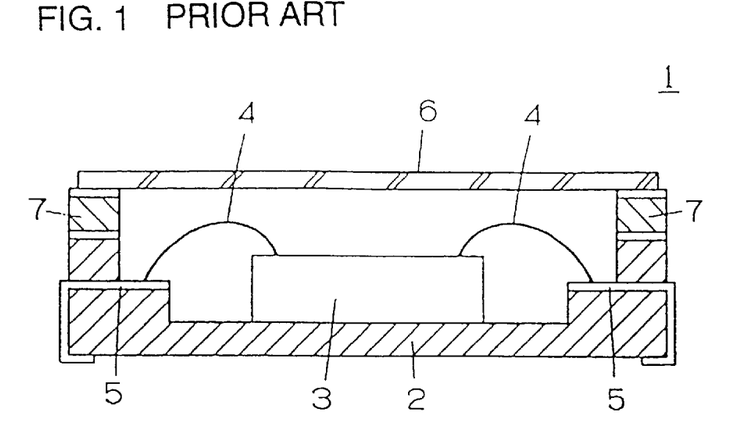
FIG. 1 is a sectional view showing the structure of a conventional surface acoustic wave device.

The structure of a conventional surface acoustic wave device 1 is shown in FIG. 1. In the surface acoustic wave device 1, a surface acoustic wave element (chip) 3 is disposed and die bonded within a ceramic package 2 of a cavity structure with a recess formed therein. The surface acoustic wave element 3 is electrically connected to electrodes 5 disposed on the ceramic package 2 through wires 4. The top surface of the ceramic package 2 is covered by a plate-shaped cap 6, and the surface acoustic wave element 3 is hermetically sealed by welding the external peripheral portion of the cap 6 on the top surface of the ceramic package 2 via a KOVAR ring 7.

In such a surface acoustic wave device 1, since a material such as Al, which has a low degree of moisture tolerance, is used as the electrode material of the surface acoustic wave element 3, corrosion of the electrodes is retarded by hermetic sealing of the surface acoustic wave element 3. A space is formed between the surface acoustic wave element 3 and the cap 6 so that elastic oscillation of the surface acoustic wave element 3 is not prevented.

However, in such a surface acoustic wave device 1, because the ceramic package 2 of a cavity structure with a recess formed thereon is required, the cost thereof is expensive. The mounting area and height (thickness) thereof are increased by the volume of the ceramic package 2 relative to the size of the surface acoustic wave element 3, so that dense mounting of the surface acoustic wave devices 1 and so forth and miniaturizing of an apparatus in which the surface acoustic wave device 1 is assembled are prevented. Furthermore, since the ceramic package 2 is used, in addition to the manufacturing processes of the ceramic package 2 itself and the KOVAR ring 7, the connecting process between the ceramic package 2 and the KOVAR ring 7, die bonding of the surface acoustic wave element 3, welding between the KOVAR ring 7 and the cap 6, etc., are required, such that the manufacturing processes are complicated and expensive.

(Second Conventional Example)

Figure 2:
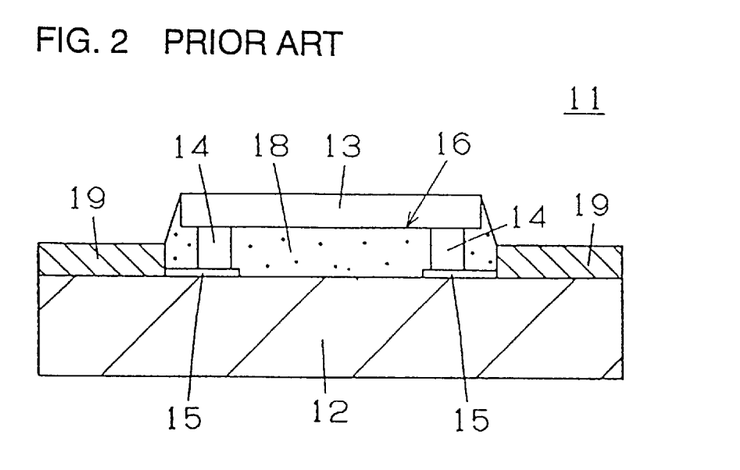
FIG. 2 is a sectional view showing the structure of another conventional surface acoustic wave device.

The structure of another conventional surface acoustic wave device 11 is shown in FIG. 2. In the surface acoustic wave device 11, a surface acoustic wave element (bare chip) 13 is flip-chip mounted face down on a wiring substrate 12; and a bump 14 disposed on the top surface of the surface acoustic wave element 13 is connected to a substrate electrode 15 disposed on the wiring substrate 12. A space between the surface acoustic wave element 13 and the wiring substrate 12 is hermetically sealed by a sealing resin 18 so as to prevent corrosion of the bump 14 and the substrate electrode 15 and damage to the connecting portions due to thermal stress differences. Flowing of the sealing resin 18 before curing is also prevented by a resin-flow-preventing membrane 19 formed on the top surface of the wiring substrate 12.

However, in the surface acoustic wave device 11, the sealing resin 18 charged between the wiring substrate 12 and the surface acoustic wave element 13 has a specific dielectric constant of 3 to 4, so that the dielectric characteristic thereof considerably affects the transmission loss and reflecting characteristics of the surface acoustic wave device 11. Also, the long time required for charging the sealing resin 18 between the wiring substrate 12 and the surface acoustic wave element 13 prevents the manufacturing process from being streamlined. Further, since the surface of the surface acoustic wave element 13 is sealed by the resin, the resulting restraint of the Mechanical Elastic Oscillation thereof may cause deterioration of the characteristics of the surface acoustic wave device 11.

(Third Conventional Example)

Figure 3:
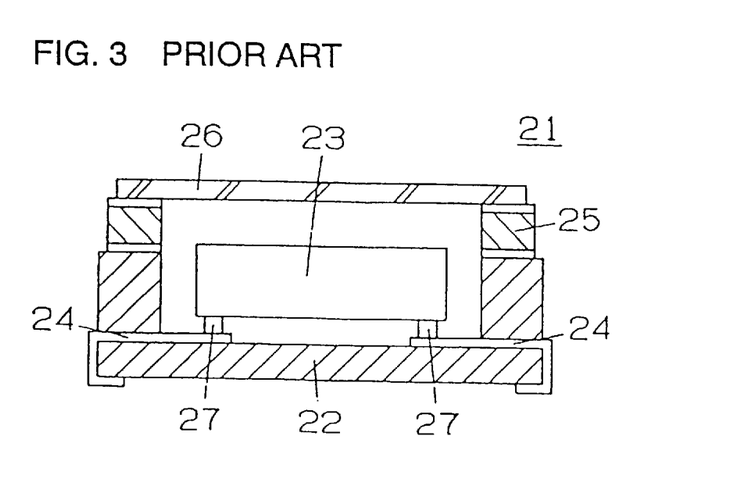
FIG. 3 is a sectional view showing the structure of still another conventional surface acoustic wave device.

In order to address the foregoing problems, a surface acoustic wave device 21 using both a ceramic package with a cavity structure, and a bump connection, is used without a sealing resin which would prevent elastic oscillation of a surface acoustic wave element and increase its transmission loss. Moreover, such a structure is capable of being miniaturized. Such a surface acoustic wave device 21 is shown in FIG. 3. In the surface acoustic wave device 21, a surface acoustic wave element 23 is disposed face down within the ceramic package 22 similar to the described one in FIG. 1; a bump 27 disposed on the top surface of the surface acoustic wave element 23 is connected to an electrode portion 24; and the outer peripheral bottom surface of a cap 26 is connected on the ceramic package 22 via a KOVAR ring 25.

In the surface acoustic wave device 21 of such structure, since the surface of the surface acoustic wave element 23 is not sealed by a resin, the surface oscillation of the surface acoustic wave element 23 is uninhibited and the characteristics of transmission, reflection, etc., in the surface acoustic wave device 21 are not deteriorated by a sealing resin. Although the ceramic package 22 is used, the need for a space for bonding the wire is eliminated by the bump connection so that the ceramic package 22 can be miniaturized.

However, in such a surface acoustic wave device 21, although the ceramic package 22 is unitized with the surface acoustic wave element 23 by the bump connection, it is not different from the first conventional example in the respect that it also uses the ceramic package 22, so that the surface acoustic wave device 21 cannot be miniaturized substantially more than the first conventional example.

(Fourth Conventional Example)

Figure 4:
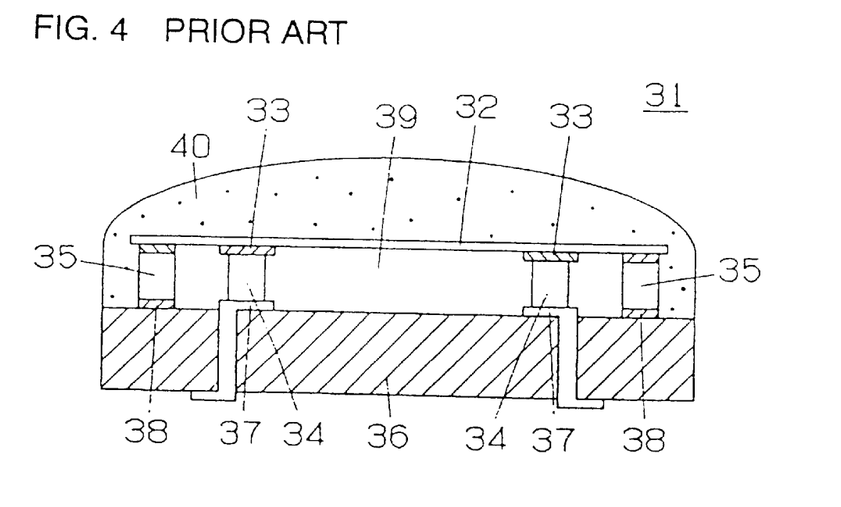
FIG. 4 is a sectional view showing the structure of a further conventional surface acoustic wave device.

Accordingly, a structure shown in FIG. 4 has been disclosed (Japanese Unexamined Patent Publication No. 9-162690) as a surface acoustic wave device 31 which neither uses the ceramic package nor has a sealing resin which restrains elastic oscillation of a SAW element's surface, thereby providing a highly reliable SAW device which can be miniaturized.

In the surface acoustic wave device 31, interdigital electrodes (not shown) and an input-output electrode 33 are disposed on the surface of the surface acoustic wave element 32 and a bump 34 in turn is formed on the input-output electrode 33. An element-side seal ring 35 is disposed on the periphery of the surface acoustic wave element 32. This surface acoustic wave element 32 is laid face down on a mounting substrate 36 so that the bump 34 is connected to a pick-out electrode 37 disposed in the mounting substrate 36 and the element-side seal ring 35 is connected to a substrate-side seal ring 38 on the mounting substrate 36 as well. A space 39 between the surface acoustic wave element 32 and the mounting substrate 36 is sealed by the connection between the element-side seal ring 35 and the substrate-side seal ring 38. The space 39 is sealed in addition by a sealing resin 40 which is coated from the back side of the surface acoustic wave element 32 so as to encapsulate the surface acoustic wave element 32, and which further provides shock protection as well.

In the surface acoustic wave device 31, the surface acoustic wave element 32 is sealed by coating the liquid sealing resin 40 on the entire surface acoustic wave element 32 and then curing the sealing resin 40. As the sealing resin 40, a conventional molding resin including a volatile solvent is used. (In the embodiment of the above-mentioned unexamined patent publication, a CRP series resin from Sumitomo Bakelite is used.) Such a sealing resin 40 is an insulator. However, in a surface acoustic wave device, a countermeasure against electromagnetic radiation is generally required, especially at higher frequencies. When it is sealed by an insulated sealing resin like that used in the surface acoustic wave device 31, it is likely to be affected by electromagnetic radiation and fail to function normally when being used at a high frequency of over 100 MHz.

In the surface acoustic wave device 31, since the surface covered by the sealing resin is curved, when the surface acoustic wave device 31 is automatically mounted by a vacuum-type chip mounter, the vacuum attraction by the chip mounter is not stable so that frequent mis-mounting may occur.

In such a surface acoustic wave device 31, the element-side and substrate-side seal rings 35 and 38, made of Au for example, are joined and unitized together by reflow-soldering both of them after they are tentatively crimped together.

However, to tentatively crimp them together, the element-side and substrate-side seal rings 35 and 38, made of Au, must be heated to approximately 250 to 400° C. When the surface acoustic wave element 32 is made of highly pyroelectric material (LiTaO$_3$ or LiNbO$_3$), the surface acoustic wave element 32 is likely to be damaged by pyroelectricity due to the heating. The pyroelectric damage causes a problem in that characteristics of the surface acoustic wave element 32 are adversely affected.

Furthermore, the substrate-side seal ring 38 and the element-side seal ring 35 are then reflow-soldered, after the tentative crimping mentioned above, in order to secure the hermeticity between the surface acoustic wave element 32 and the mounting substrate 36. However, since the melting point of Au is approximately 1000° C., when heating for reflow soldering, the element-side seal ring 35 and the substrate-side seal ring 38 are required to be heated to approximately 1000° C. or higher. In the surface acoustic wave device 31, Al is generally used as wiring material, having an approximate melting point of 660° C., which means that the Al wiring will be melted by the reflow heating. When the Al wiring is cut off in this manner, the required electric characteristics cannot be obtained, resulting in producing defective surface acoustic wave devices 31.

SUMMARY OF THE INVENTION

The present invention can solve the problems associated with the conventional devices and provides a small-sized enclosure-type electronic component of simple structure having excellent electric characteristics, and also provides a method for producing an electronic component in which high yield electronic components can be produced without defective products.

An electronic component comprises a substrate having a surface on which an electrode is formed and a circuit element having a surface on which a circuit is formed. The circuit element is held such that the surface of the circuit element and the surface of the substrate are opposed to each other. A bump electrode joins the circuit on the circuit element and the electrode on the substrate together, and a sealing material joins the circuit element and the substrate together at the periphery of the space between the circuit-forming surface of the circuit element and the substrate. The space between the circuit-forming surface of the circuit element and the substrate is hermetically sealed by the circuit element, the substrate, and the sealing material.

In this electronic component, a circuit element and a substrate form the component package; a space between the circuit element and the substrate is formed by a bump electrode; and the space between the circuit element and the substrate is sealed by the circuit element, the substrate, and a peripheral sealing material. Therefore, a ceramic package is not required, so that the electronic component can be miniaturized and the cost can be reduced. Furthermore, since the top surface of the circuit element is not covered by a sealing material, the surface thereof can be smoothed, resulting in preventing mounting mistakes during mounting electronic components by an automatic mounter such as a vacuum-type chip mounter.

Advantageously, a low-temperature soldering material such as solder, or an adhesive, is used as the sealing material. "Low-temperature" in this context means that the soldering material melts at a temperature below the melting point of Au, and furthermore, at a low enough temperature to avoid the problems described above. Since the circuit element and the substrate can be joined together at a comparatively low temperature, the circuit element will not be damaged by the heat, enabling the incidence of defective products to be reduced. When a soldering material such as solder or an adhesive is used as the sealing material, the space between the circuit element and the substrate can securely and hermetically be sealed even if the top of the circuit element is not covered by a sealing resin.

The size of the circuit element may be approximately the same as the size of the substrate in the electronic component.

In the electronic component of such structure, the electronic component can be miniaturized by minimizing the size of the substrate, so that a miniature electronic component can be formed.

The bump electrode may be formed of Au as a principal ingredient. When the bump electrode formed of Au as a principal ingredient is used, the joining can easily be achieved and resistance across the joined portion can be reduced as well.

A method for producing electronic components according to an embodiment of the present invention, comprises the steps of: disposing a bump electrode on either a circuit formed on a circuit element or an electrode disposed on a substrate; disposing a sealing material having a smaller height than said bump electrode on the periphery of either the surface on which the circuit is formed on the circuit element or the substrate so as to surround the circuit formed on the circuit element; disposing the surface on which the circuit is formed so as to oppose the substrate; grounding the circuit via the electrode on the substrate by placing the circuit in contact with the electrode on the substrate through the bump electrode; connecting the circuit to the electrode on the substrate through the bump electrode by applying pressure to the bump electrode; and hermetically sealing the periphery of the space between the circuit element and the substrate with the sealing material.

When an electronic component is produced in this manner, since the circuit is grounded by making contact with the circuit on the substrate via the bump electrode, pyroelectric charge produced in the circuit element when joining the circuit element to the substrate can be dissipated via the bump electrode from the substrate side to ground, so that pyroelectric damage of the circuit element can be prevented.

The circuit element and the substrate are joined together by simultaneously depositing the bump electrode and the sealing material, so that the manufacturing process of the electronic component can be simplified to increase the manufacturing efficiency.

The method may further comprise the steps of joining and unitizing a plurality of circuit elements together on the substrate, the substrate having a size corresponding to a plurality of circuit elements; and then separating the substrate on which the plurality of circuit elements are mounted, to form a plurality of individual electronic components.

In this embodiment, plural electronic components can be produced all at once, so that the efficiency of production of the electronic components can be increased.

For the purpose of illustrating the invention, there are shown in the drawings several forms which are presently preferred, it being understood, however, that the invention is not limited to the precise arrangements and instrumentalities shown.

DETAILED DESCRIPTION OF EMBODIMENTS OF THE INVENTION

Hereinafter, embodiments of the present invention are explained in detail with reference to the drawings.

(First Embodiment)

Figure 5A:
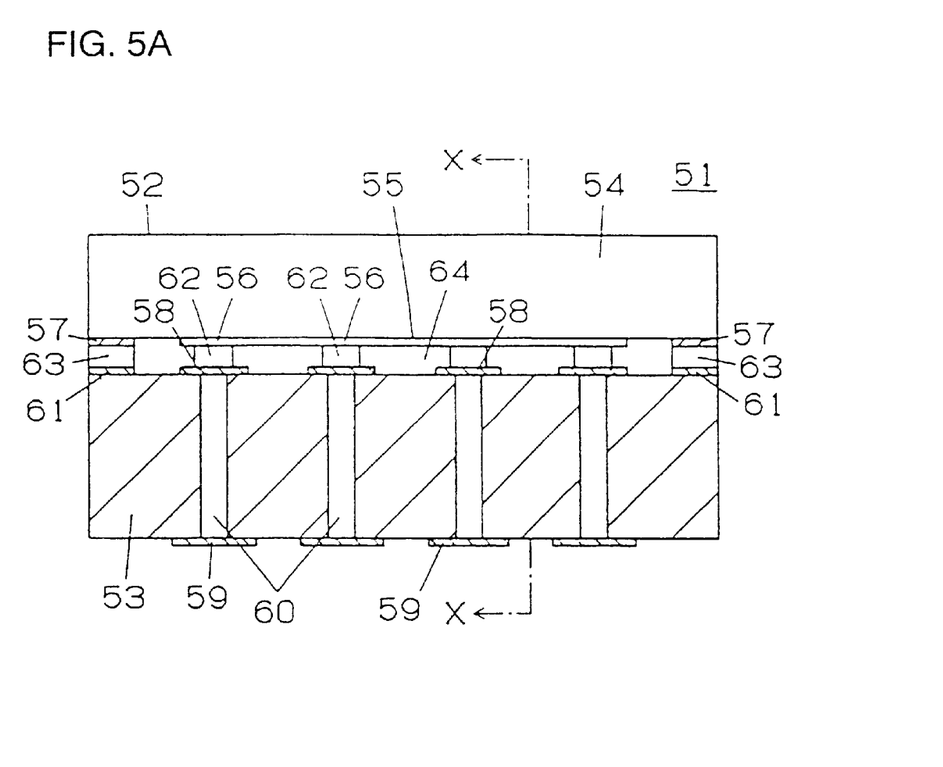
FIG. 5A is a sectional view of a surface acoustic wave device according to one embodiment of the present invention.
Figure 5B:
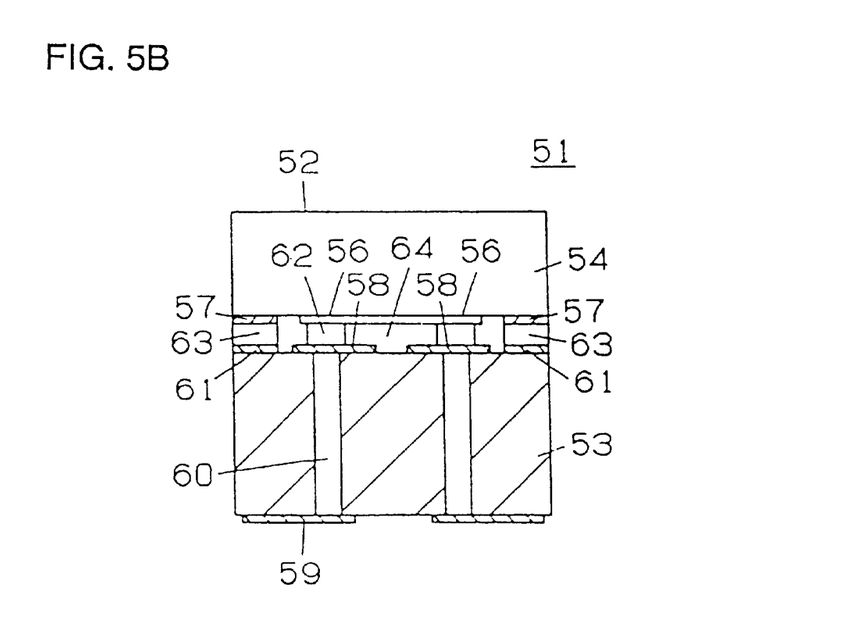
FIG. 5B is a sectional view of the surface acoustic wave device shown in FIG. 5A, taken along the line X—X in FIG. 5A.

FIGS. 5A and 5B are sectional views of a surface acoustic wave device 51 according to one embodiment of the present invention. Numeral 52 represents a surface acoustic wave element which is mounted face down on a mounting substrate 53. In the surface acoustic wave element 52, on a surface of a piezoelectric substrate 54 formed of a crystal, $LiTaO_3$, $LiNbO_3$, etc., two sets of interdigital electrodes (IDT electrodes) 55 formed of Al, etc. are formed, and an input-output electrode 56 is formed for each set of interdigital electrodes 55. On a surface of the piezoelectric substrate 54, an element-side seal ring 57 is formed along the entire periphery thereof.

The mounting substrate 53 has approximately the same length-to-width size as that of the surface acoustic wave element 52. On the top and bottom surfaces of the mounting substrate 53, an internal picking-out electrode 58 and an external electrode 59 are disposed, respectively, opposing each other, and the electrodes 58 and 59 are conductively connected to each other via a through-hole 60 formed in the mounting substrate 53 so as to penetrate both sides thereof. Along the entire peripheral portion of the top surface of the mounting substrate 53, a substrate-side seal ring 61 is further disposed.

Next, the surface acoustic wave element 52 is laid face down on the mounting substrate 53, and the input-output electrode 56 is joined to the internal picking-out electrode 58 of the mounting substrate 53 by a bump electrode 62, formed of Au as a principal ingredient, such as an Au bump. The element-side seal ring 57 and the substrate-side seal ring 61 are joined by a sealing material 63. Thus, the space 64 between the internal surface of the surface acoustic wave element 52 (the surface on which the interdigital electrodes 55 are disposed) and the mounting substrate 53 is hermetically sealed by joining the element-side seal ring 57 to the substrate-side seal ring 61 using the sealing material 63. As the sealing material 63, a soldering material formed of Sn or Pb as a principal ingredient is used: for example, Sn group solder, Pb group solder, several kinds of Pb free solder and so forth may be used.

In the surface acoustic wave device 51 of such structure, a ceramic package like those in the first conventional example and the third conventional example is not used, and since the sealing structure is formed by the surface acoustic wave element 52 and the mounting substrate 53 themselves, miniaturizing and height reduction of the surface acoustic wave device 51 can be achieved. Since the expensive ceramic package is not used, the cost can also be reduced. Since the bump electrode 62 is used for connecting the surface acoustic wave element 52 to the mounting substrate 53, the space 64 between the internal surface of the surface acoustic wave element 52 and the mounting substrate 53 can be secured by the height of the bump electrode 62 so that elastic oscillation of the surface acoustic wave element 52 is not restrained. Furthermore, since wire is not used for bonding, the space for wiring is not required so that the surface acoustic wave device 51 can be even more miniaturized.

In the surface acoustic wave device 51 according to the present invention, since the space 64 within which the interdigital electrodes 55 are contained is sealed by only the surface acoustic wave element 52, the mounting substrate 53, and the sealing material 63, the sealing resin as in the second conventional example and the fourth conventional example is not required, so that characteristics of the surface acoustic wave device 51 are not deteriorated. Furthermore, since the sealing resin is not used, the top surface of the surface acoustic wave device 51 can be formed smoothly, so that the mounting of the components can easily be performed by a chip mounter, etc.

Furthermore, in this surface acoustic wave device 51, since the surface thereof is not covered by the sealing resin, it is therefore a smooth surface, so it is easily picked up by a vacuum-type chip mounter, etc., so that the component mounting can securely be performed.

Figure 6A:
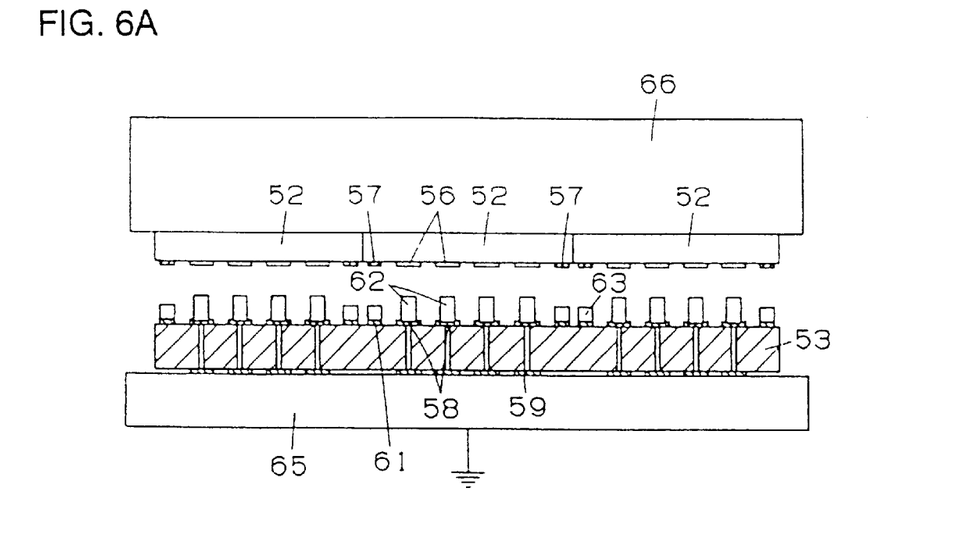
FIGS. 6A to 6E are sectional views showing a method for producing the surface acoustic wave device shown in FIGS. 5A and 5B.

Next, referring to FIGS. 6A to 6E, a method for producing the surface acoustic wave device 51 will be described. As shown in FIG. 6A, a crimping stage 65 is grounded to be maintained at a ground potential, and on the crimping stage 65, the mounting substrate 53, which in this method is a multiple substrate having a size (area) corresponding to a plurality of the surface acoustic wave elements 52, is disposed in a predetermined position. A plurality of through-holes 60 are formed in the mounting substrate 53 so as to penetrate both sides thereof. The top end of each through-hole 60 is conductively connected to an internal picking-out electrode 58 formed on the top surface of the mounting substrate 53, while the bottom end of the through-hole 60 is conductively connected to an external electrode 59 formed on the bottom of the mounting substrate 53, so that each internal picking-out electrode 58 and each external electrode 59 are conductively connected to each other in a one-to-one relationship via the through-hole 60. On the top surface of each internal picking-out electrode 58, the bump electrode 62 formed of Au is disposed by a wire bonding technique, such as the method for fusion connecting an Au wire. In the entire outer periphery of the region corresponding to one surface acoustic wave device 51 on the top surface of the mounting substrate 53, the substrate-side seal ring 61 formed of a metallic material having excellent wetting characteristics for soldering is disposed. As the metallic material having excellent wetting characteristics for soldering, a double-layer structure such as an Au layer deposited on a Ni layer may be used. On the entire periphery of the top surface of this substrate-side seal ring 61, the sealing material 63 formed of a soldering material such as solder is laid. The sealing material 63 may be formed by placing solder paste on the substrate-side seal ring 61 by a printing method, for example; reflow soldering in the presence of the solder paste only; and then cleaning the solder paste to eliminate flux remnants. The height of each bump electrode 62 is set to be larger than the height of the sealing material 63 on the mounting substrate 53 before joining.

On the other hand, on the bottom surface of a thermal compression bonding tool 66 positioned above the crimping stage 65, a plurality of the surface acoustic wave elements 52 formed by the interdigital electrodes 55 and the input-output electrodes 56, etc., on the top surface thereof are held face down by vacuum in a position for being mounted on the mounting substrate 53.

Figure 6B:
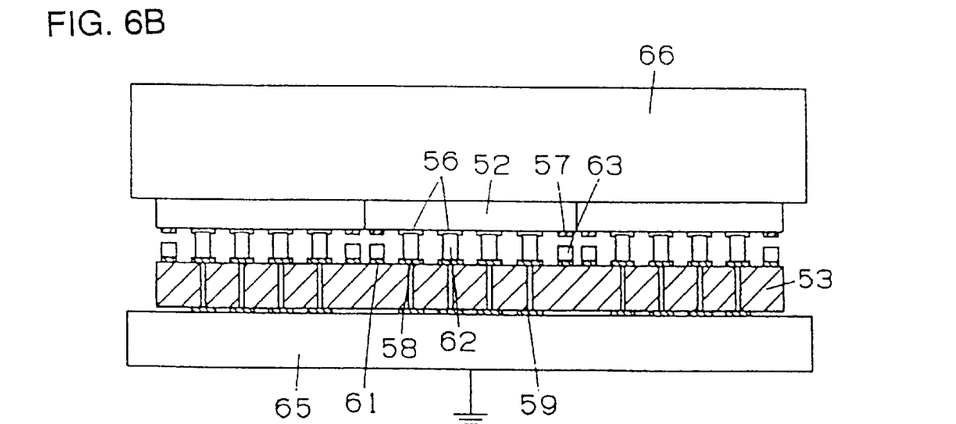
Figure 6C:
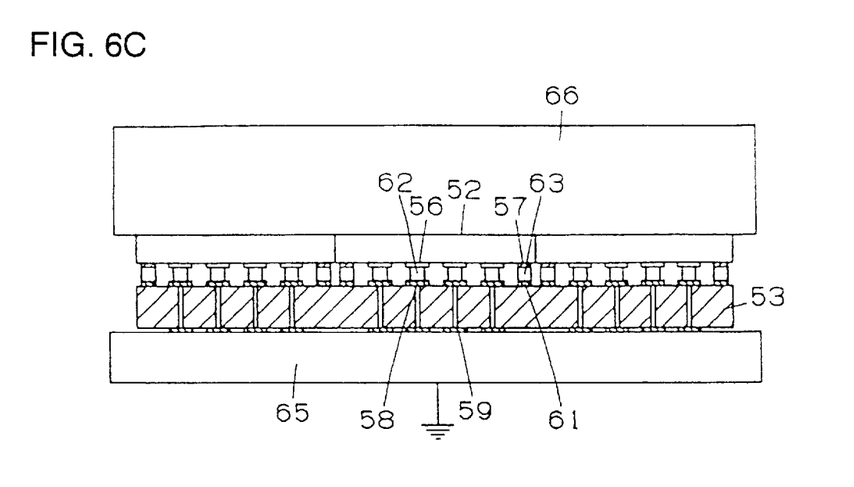

In this manner, the mounting substrate 53 positioned on the crimping stage 65 and the surface acoustic wave element 52 held by the thermal compression bonding tool 66 on the bottom surface thereof are disposed opposing each other. After being positioned, as shown in FIG. 6B, they are placed in contact with each other. At this time, since the height of the bump electrode 62 is larger than the height of the sealing material 63, when the thermal compression bonding tool 66 is lowered: first, as shown in FIG. 6B, the bump electrode 62 strikes the input-output electrode 56 of the surface acoustic wave element 52; the thermal compression bonding tool 66 is heated to 250° C. to 400° C.; the bump electrode 62 is crushed by the heat and pressure of the thermal compression bonding tool 66 when the thermal compression bonding tool 66 is further lowered by applying pressure; and thereby, as shown in FIG. 6C, the sealing material 63 of the mounting substrate 53 touches the element-side seal ring 57 of the surface acoustic wave elements 52. At this time, sufficient heat is applied to melt the sealing material 63 formed of soldering material such as solder, and pressure is applied by the thermal compression bonding tool 66 to the surface acoustic wave elements 52 and the mounting substrate 53. The pressure breaks the oxide membrane of the melting surface of the sealing material 63, which joins the sealing material 63 to the element-side seal ring 57 of each surface acoustic wave element 52; and simultaneously, the bump electrodes 62 on the mounting substrate 53 are diffusion-bonded by the heat of the thermal compression bonding tool 66 to the corresponding input-output electrodes 56 of the surface acoustic wave elements 52. In this manner, the joining of the sealing material 63 and the joining of the bump electrodes 62 can be performed simultaneously, so that the number of steps can be reduced for simplification of the process.

In the fourth conventional example, it is required to reflow-solder the substrate-side seal ring and the element-side seal ring at approximately 1000° C. In accordance with the present invention, since the sealing material 63 formed of solder, etc., is used, the surface acoustic wave elements 52 and the mounting substrate 53 can be joined together by heating at 250° C. to 400° C. so as to seal the space 64, resulting in fewer defective products due to breaks in wiring, etc.

As described above, since the height of the bump electrode 62 is to be larger than the height of the sealing material 63 before joining, when the surface acoustic wave elements 52 and the mounting substrate 53 are joined together, before the surface acoustic wave elements 52 and the mounting substrate 53 are joined together by the sealing material 63, the bump electrodes 62 can be crushed to be securely joined to the input-output electrodes 56 of the surface acoustic wave element 52.

As mentioned above, since the surface acoustic wave elements 52 has pyroelectricity, when the temperature is changed, electric charge (pyroelectric charge) is accumulated on the surface thereof. By this mechanism, a discharge is produced between the interdigital electrodes 55, so that the interdigital electrodes 55 can be locally melted, which is likely to cause defective products. This phenomenon is called pyroelectric damage and as pyroelectric-damage-prone materials, $LiTaO_3$, $LiNbO_3$, etc., are known. The pyroelectric damage can be prevented by letting the charge escape swiftly from the surface acoustic wave elements 52. This is accomplished in the present method as follows. In the surface acoustic wave device 51, the height of the bump electrode 62 is to be larger than the height of the sealing material 63, and when the surface acoustic wave elements 52 and the mounting substrate 53 are unitized, first, the bump electrode 62 is urged into contact with the input-output electrode 56; and the charge on the surface acoustic wave elements 52 escapes to the mounting substrate 53 via the bump electrodes 62. The metal crimping stage 65 is grounded and the mounting substrate 53 is laid on the crimping stage 65. The external electrodes 59 in the mounting substrate 53 are electrically connected to the crimping stage 65. The bump electrodes 62 on the mounting substrate 53 are also in a grounded state via the internal picking-out electrodes 58, the through-holes 60, the external electrodes 59, and the crimping stage 65. Accordingly, the charge escaping to the mounting substrate 53 is dissipated to ground via the crimping stage 65. When the temperature of the bump electrode 62 is increased for joining after it is urged into contact with the surface acoustic wave elements 52, the charge produced on the surface acoustic wave elements 52 is dissipated to ground via the bump electrode 62, the mounting substrate 53, and the crimping stage 65. Therefore, even if a piezoelectric substrate material having high pyroelectricity is used, the surface acoustic wave element 52 and the mounting substrate 53 can be joined together without causing the pyroelectric damage.

In addition, although in FIGS. 6A and 6B, the bump electrodes 62 are initially disposed on the mounting substrate 53, the bump electrodes 62 also may be disposed on the surface acoustic wave elements 52. However, if a technique such as wire bumping is utilized, to form the bump electrodes 62 on the surface acoustic wave elements 52, a wafer is heated while forming the bump electrode, resulting in probable pyroelectric damage. Therefore, by disposing the bump electrode 62 instead on the mounting substrate 53, the surface acoustic wave device 51 can be produced with higher yield.

Figure 6D:
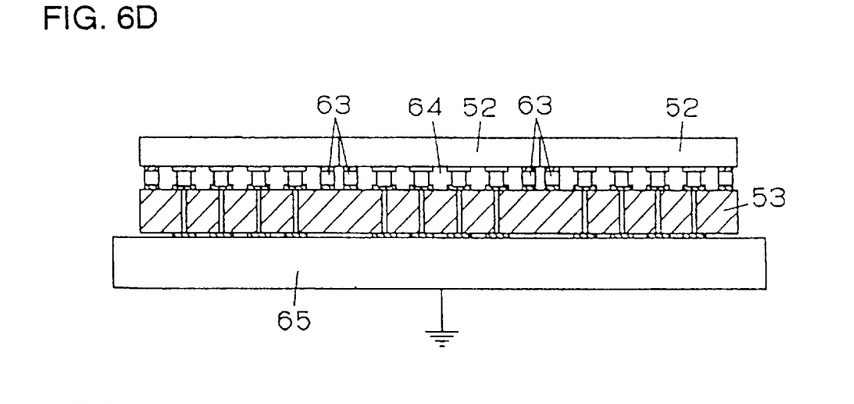
Figure 6E:
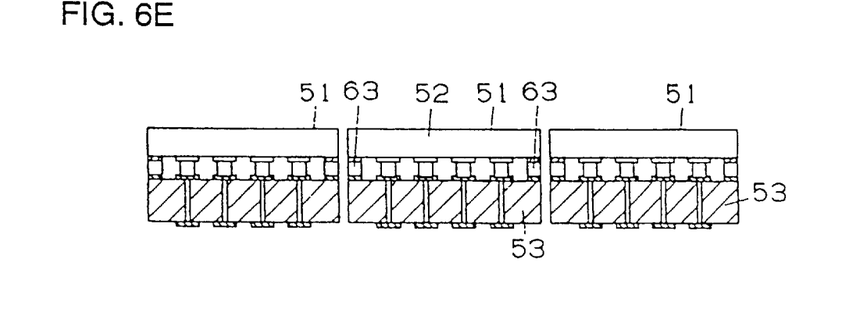

After the surface acoustic wave elements 52 and the mounting substrate 53 are finished being joined together in this manner, as shown in FIG. 6D, the thermal compression bonding tool 66 is retracted from the position on the crimping stage 65; the surface acoustic wave device 51 joined together is cooled; and the electric charge produced during cooling is dissipated to ground via the crimping stage 65. After the surface acoustic wave device 51 is cooled, as shown in FIG. 6E, the mounting substrate 53 (multiple substrate) is cut apart by dicing, so as to simultaneously produce a plurality of surface acoustic wave devices 51, as shown in FIGS. 5A–5B. Although the surface acoustic wave device 51 may be produced one by one, the surface acoustic wave device 51 can more efficiently be produced by simultaneously producing a plurality of them and then splitting them apart as in this embodiment.

(Second Embodiment)

Figure 7A:
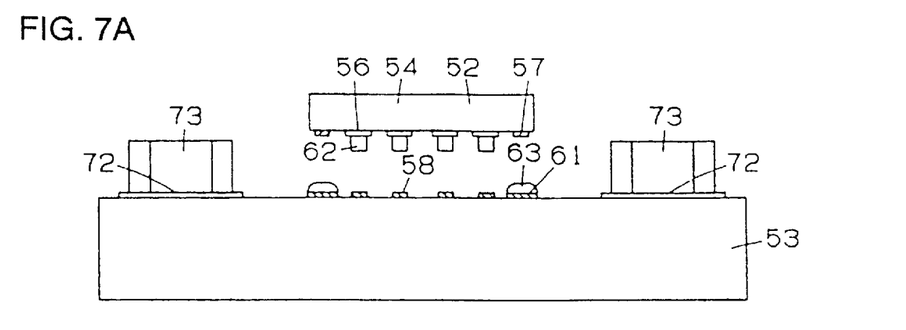
FIGS. 7A to 7C are sectional views showing a method for producing a surface acoustic wave device according to another embodiment of the present invention.
Figure 7B:
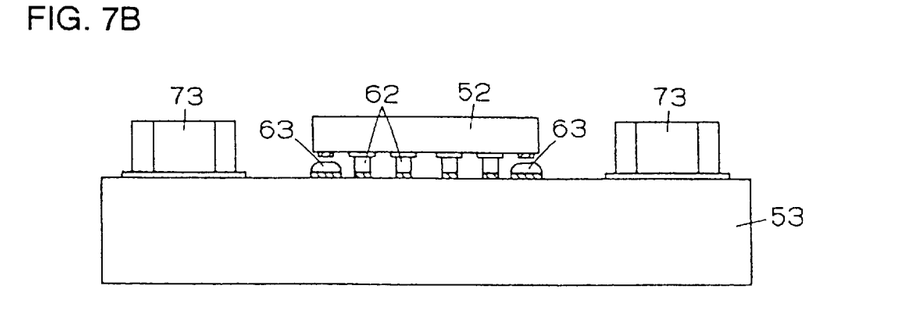
Figure 7C:
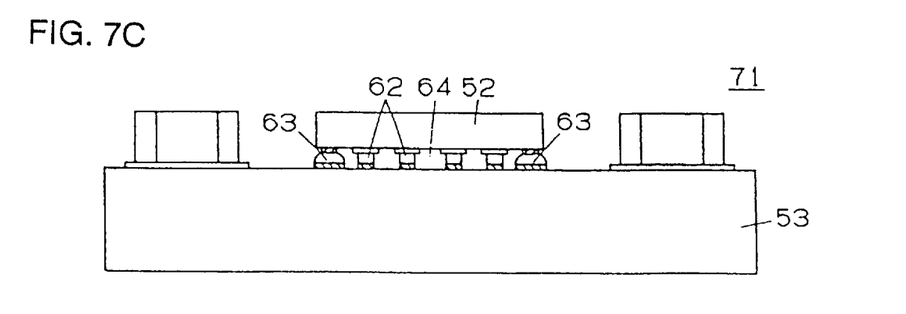

FIGS. 7A to 7C are schematic representations showing the structure and a method for producing a surface acoustic wave device 71 according to another embodiment of the present invention. In this embodiment: a mounting substrate 53 formed of a printed wiring board or a ceramic board, etc., has a larger area than that of a surface acoustic wave element 52; in an element mounting region on the top surface of the mounting substrate 53, a substrate-side seal ring 61 and an internal pick-out electrode 58 are disposed; on the top of the substrate-side seal ring 61, a sealing material 63 formed of soldering material such as solder is laid; the internal pick-out electrode 58 is conductively connected to an external electrode (not shown in FIGS. 7A to 7C) which is formed to be electrically connected to a crimping stage; and on other regions than the SAW element mounting region of the mounting substrate 53, wiring patterns 72 are formed, on which required surface mounting components 73 are mounted by soldering, etc.

On the other hand, on the surface of the surface acoustic wave element 52, input-output electrodes 56 of interdigital electrodes 55 and an element-side seal ring 57 are formed, and bump electrodes 62 are formed on the input-output electrodes 56. In this embodiment, the height of the bump electrode 62 is also larger than the height of the sealing material 63.

As in the first embodiment shown in FIGS. 6A–6E, the method shown in FIG. 7A is as follows: the above-mentioned mounting substrate 53 is laid on the crimping stage (not shown), which is grounded; and the surface acoustic wave element 52 is held face down by vacuum on the bottom surface of the thermal compression bonding tool (not shown). Next, as shown in FIG. 7B, the surface acoustic wave element 52 is mounted on the mounting substrate 53; and the bump electrode 62 is touched to the internal picking-out electrode 58 of the mounting substrate 53. In this state, the bump electrode 62 is grounded via the crimping stage 65, etc., so that the charge produced in the surface acoustic wave element 52 is dissipated to ground. At this time, the sealing material 63 is still separate from the element-side seal ring 57.

After the bump electrode 62 is touched to the internal picking-out electrode 58 in this manner, the surface acoustic wave element 52 and the mounting substrate 53 are heated while being crimped by the thermal compression bonding tool and the crimping stage such that, as shown in FIG. 7C, the bump electrode 62 is joined to the internal picking-out electrode 58 and further the sealing material 63 is melted to be welded to the element-side seal ring 57.

In this embodiment also, a case such as a ceramic package also is not required, so that miniaturizing and reducing the height of the surface acoustic wave device can be achieved and the cost can also be reduced. Moreover, hermeticity of the surface acoustic wave element 52 can be secured by sealing the periphery of the space between the surface acoustic wave element and the mounting substrate by a sealing material such as solder. Furthermore, since other components can be mounted on the mounting substrate 53, mounting density of components can be increased, so that the degree of integration of every circuit is increased.

(Third Embodiment)

Figure 8:
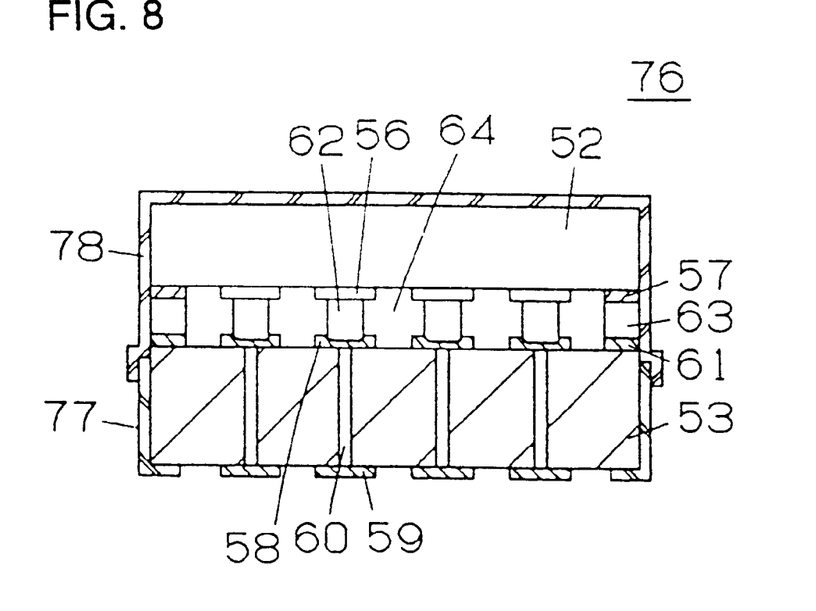
FIG. 8 is a sectional view showing a surface acoustic wave device according to still another embodiment of the present invention.

FIG. 8 is a sectional view showing the structure of a surface acoustic wave device 76 according to still another embodiment of the present invention. In this surface acoustic wave device 76, a conductive film 77 is formed so as to cover the external surface of the mounting substrate 53; a conductive film 78 is formed so as to cover the external surfaces of the surface acoustic wave element 52 and the sealing material 63; and the conductive films 77 and 78 are connected to each other. The conductive films 77 and 78 are connected to one or more external electrode 59 for grounding, while being insulated from the other external electrodes 59.

In accordance with this embodiment, even if an insulated mounting substrate 53 is used, the surface acoustic wave device 76 is provided with electromagnetic radiation-noise control shielding. In addition, the conductive films 77 and 78 can be formed by a resin sheet on which conductive particles are dispersed, molding a metallic sheet, or a resin molding in which conductive particles are mixed and dispersed.

(Fourth Embodiment)

Figure 9:
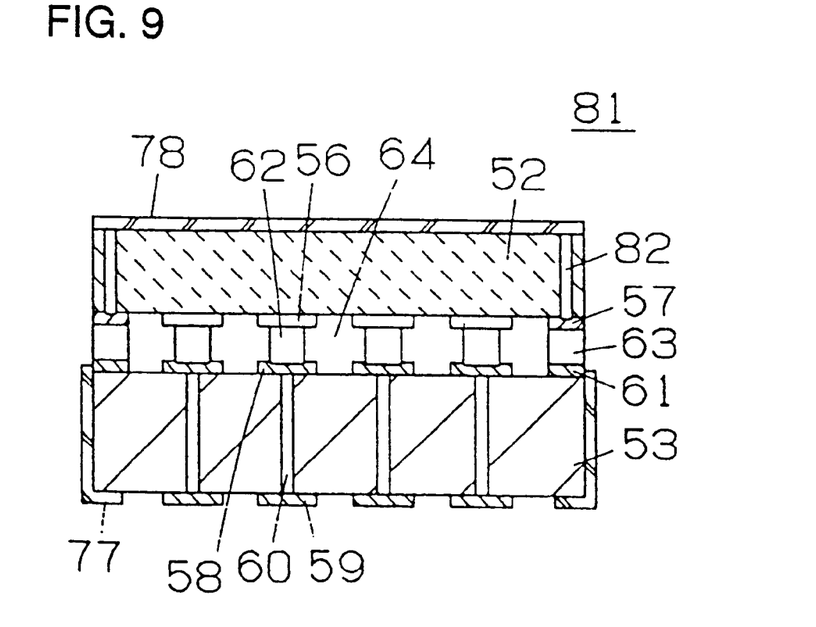
FIG. 9 is a sectional view showing a surface acoustic wave device according to a further embodiment of the present invention.

FIG. 9 is a sectional view showing the structure of a surface acoustic wave device 81 according to a further embodiment of the present invention. This surface acoustic wave device 81 also has an electromagnetic shielding effect. The element-side conductive film 78 is disposed only on the backside of the surface acoustic wave element 52 and is connected to the conductive film 77 of the mounting substrate 53 via a through-hole 82 formed in the surface acoustic wave element 52 and the sealing material 63.

Therefore, in this embodiment, electromagnetic radiation-noise control shielding can also be provided to the surface acoustic wave device using the insulated mounting substrate 53.

In each of the above-described embodiments, the case in which the bump electrode is formed of Au and the sealing material is formed of a soldering material such as solder is described. However, the bump electrode and the sealing material may also be formed of conductive adhesives having identical or similar curing conditions. As for the method for joining the bump electrode and the sealing material, the use of heating is not necessarily possible, and ultrasonics, pressure, vibration, etc. may be utilized as well.

While embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A method for producing electronic components comprising the steps of:

disposing a bump electrode in connection with either one of a circuit formed on a circuit element and an electrode disposed on a substrate;

disposing a sealing material having a height smaller than that of said bump electrode on either one of the surface on which said circuit is formed and said substrate so as to surround the circuit formed on the circuit element;

grounding the circuit via the electrode on the substrate by disposing the surface on which the circuit is formed on the circuit element so as to oppose the substrate and to define a space between the circuit element and the substrate, and then placing the circuit in electrical contact with the electrode on the substrate via the bump electrode;

connecting the circuit of the circuit element to the electrode on the substrate through the bump electrode by applying pressure to the bump electrode; and simultaneously hermetically sealing the periphery of the space between the circuit element and the substrate with a sealing material.

2. A method according to claim 1, further comprising the step of joining and unitizing a plurality of circuit elements together on the substrate, the substrate having a size corresponding to that of a plurality of circuit elements; and then separating the substrate on which the plurality of circuit elements are mounted, to form a plurality of individual electronic components.

3. A method according to claim 1, wherein a principal ingredient of the bump electrode is Au.

4. A method according to claim 3, wherein the sealing material is selected from the group consisting of a low-temperature soldering material and an adhesive.

5. A method according to claim 1, wherein the sealing material is selected from the group consisting of a low-temperature soldering material and an adhesive.

* * * * *